US008723990B2

(12) United States Patent
Hynecek

(10) Patent No.: US 8,723,990 B2
(45) Date of Patent: May 13, 2014

(54) IMAGE PIXEL EMPLOYING FLOATING BASE READOUT CONCEPT, AND IMAGE SENSOR AND IMAGE SENSOR ARRAY INCLUDING THE IMAGE PIXEL

(71) Applicant: Intellectual Ventures II LLC, Wilmington, DE (US)

(72) Inventor: Jaroslav Hynecek, Allen, TX (US)

(73) Assignee: Intellectual Ventures II LLC, Wilmington, DE (US)

( * ) Notice: Subject to any disclaimer, the term of this patent is extended or adjusted under 35 U.S.C. 154(b) by 0 days.

(21) Appl. No.: 13/748,744

(22) Filed: Jan. 24, 2013

(65) Prior Publication Data
US 2013/0234784 A1    Sep. 12, 2013

Related U.S. Application Data

(63) Continuation of application No. 12/003,316, filed on Dec. 21, 2007, now Pat. No. 8,373,781.

(30) Foreign Application Priority Data

Dec. 22, 2006    (KR) .................. 10-2006-0132634

(51) Int. Cl.
H04N 5/357    (2011.01)
(52) U.S. Cl.
USPC ............................ 348/248; 348/294; 348/241
(58) Field of Classification Search
None
See application file for complete search history.

(56) References Cited

U.S. PATENT DOCUMENTS

| 4,677,490 | A | 6/1987 | Levine |
| 5,404,039 | A | 4/1995 | Watanabe |
| 5,904,493 | A | 5/1999 | Lee et al. |
| 6,049,118 | A | 4/2000 | Nagano |
| 6,064,053 | A | 5/2000 | Chi |
| 7,119,322 | B2 | 10/2006 | Hong |
| 7,804,113 | B2 | 9/2010 | Swain et al. |
| 2004/0046881 | A1 | 3/2004 | Utagawa |

(Continued)

FOREIGN PATENT DOCUMENTS

| JP | 61-070877 | 11/1986 |
| JP | 04-094276 | 3/1992 |
| JP | 11-214667 | 8/1999 |
| JP | 2000-077642 | 3/2000 |
| JP | 2005-051136 | 2/2005 |
| JP | 2005-311487 | 11/2005 |
| JP | 2008-526062 | 7/2008 |
| KR | 2004-0049864 | 6/2006 |
| KR | 2006-7004629 | 8/2008 |

Primary Examiner — Antoinette Spinks
Assistant Examiner — Angel L Garces-Rivera
(74) Attorney, Agent, or Firm — McAndrews, Held & Malloy, Ltd.

(57) ABSTRACT

A pixel of an image sensor includes only two signal lines per pixel, a pinned photodiode for sensing light, a floating base bipolar transistor, and no reset and address transistors. The floating base bipolar transistor provides the pixel with a gain, which can increase pixel sensitivity and reduce noise. The pixel also incorporates a vertical blooming control structure for an efficient blooming suppression. The output terminals of the pixel are coupled to a common column output line terminated by a special current sensing correlated double sampling circuit, which is used for subtraction of emitter leakage current. Based on this structure, the pixel has high sensitivity, high response uniformity, low noise, reduced size, and efficient layout.

18 Claims, 4 Drawing Sheets

(56) References Cited

U.S. PATENT DOCUMENTS

| | | |
|---|---|---|
| 2004/0262619 A1 | 12/2004 | Takahashi et al. |
| 2005/0248675 A1 | 11/2005 | Hashimoto et al. |
| 2006/0038904 A1 | 2/2006 | Kudoh |
| 2006/0082667 A1* | 4/2006 | Rhodes ................... 348/308 |
| 2006/0108613 A1 | 5/2006 | Song et al. |
| 2007/0013797 A1 | 1/2007 | McKee |
| 2007/0045668 A1 | 3/2007 | Brady et al. |
| 2007/0090394 A1 | 4/2007 | Bui et al. |
| 2007/0091190 A1 | 4/2007 | Iwabuchi et al. |
| 2008/0217659 A1 | 9/2008 | Hung et al. |
| 2008/0217716 A1 | 9/2008 | Mauritzson |

* cited by examiner

IMAGE PIXEL EMPLOYING FLOATING BASE READOUT CONCEPT, AND IMAGE SENSOR AND IMAGE SENSOR ARRAY INCLUDING THE IMAGE PIXEL

CROSS-REFERENCE TO RELATED APPLICATIONS

The present application is a continuation of U.S. application Ser. No. 12/003,316, filed Dec. 21, 2007, which claims priority of Korean patent application number 10-2006-0132634, filed on Dec. 22, 2006, both of which are incorporated herein by reference in their entireties.

BACKGROUND OF THE INVENTION

The present invention relates to an image sensor, and more particularly, to an image sensor with high resolution, high performance and small pixel sizes. For this purpose, the present invention provides a pixel having a vertical blooming control structure, one address line and one column output line per pixel without having additional charge transfer and reset lines. The present invention also provides a pixel having an integrated bipolar transistor gain stage where charge received from a pinned diode is multiplied several times before a signal is transferred on a common column output line and processed by a current sensing column correlated double sampling (CDS) circuit.

Typical image sensors sense light by converting impinging photons into electrons that are integrated (collected) in sensor pixels. After completion of the integration cycle, collected charge is converted into a voltage, which is supplied to an output terminal of the sensor. In a typical complementary metal-oxide semiconductor (CMOS) image sensor, the charge-to-voltage conversion is accomplished directly in pixels and an analog pixel voltage is transferred to an output terminal through various pixel addressing and scanning schemes. An analog signal may be converted on-chip to a digital equivalent before reaching a chip output. The pixels have incorporated in them a buffer amplifier, typically a source follower, which drives sense lines that are connected to the pixels by suitable addressing transistors. After the charge-to-voltage conversion is completed and the resulting signal transferred out from the pixels, the pixels are reset in order to be ready for accumulation of new charge. In a pixel that uses a floating diffusion (FD) node as a charge detection node, the reset is accomplished by turning on a reset transistor that momentarily conductively connects the FD node to a voltage reference. This step removes the collected charge; however, it generates kTC-reset noise as is well known in the art. The kTC-reset noise has to be removed from a signal by a correlated double sampling (CDS) signal processing technique in order to achieve desired low noise performance. The typical CMOS image sensor that utilizes the CDS concept needs, to have four transistors (4T) per pixel. An example of the 4T pixel circuit can be found in U.S. Pat. No. 5,904,493 issued to Lee et al. in the name of "Active Pixel Sensor Integrated With A Pinned Photodiode."

FIG. 1 illustrates a simplified cross-sectional view of a conventional complementary metal-oxide semiconductor (CMOS) image sensor pixel with a pinned photodiode and an associated pixel circuit. A P-type silicon-based substrate 101 disposed on a P$^+$-type substrate 123 has a shallow trench isolation (STI) region 102 etched in a surface of the P-type substrate 101 and filled with a silicon dioxide layer 103. The silicon dioxide layer 103 also covers the remaining surface of the P-type substrate 101. A shallow P-type doping region 104 passivates walls and a bottom of the STI region 102 as well as the surface of the P-type substrate 101. Photo-generated charge is collected in an N-type doping region 105 of the pinned photodiode.

When the charge integration cycle is completed, the charge from the N-type doping region 105 is transferred to a floating diffusion (FD) region 106 by turning a gate 107 momentarily on. A first transistor 118 resets the FD region 106 to a suitable potential (e.g., approximately the power supply voltage (Vdd) level), and a second transistor 114 senses the FD potential change. A capacitor 119, which is also labeled as Cs in FIG. 1, is connected between a first node 117 in a Vdd line and a second node 113 connected to the FD region 106, and is used to adjust a conversion gain of the pixel. This capacitor 119 can be omitted from the circuit if necessary. The pixel is addressed via a third transistor 115. Herein, the gate 107 may be a gate of a transfer transistor, and the first and third transistors 118 and 115 may be reset and selection transistors, respectively.

Multiple control signals are supplied to the pixel via transfer gate, reset gate and address gate buses 112, 120 and 121, which are also labeled respectively as Tx, Rx and Sx in FIG. 1. An output of the pixel is supplied to a pixel column bus 116. When photons 122 impinge on the pixel, the photons 122 penetrate into the silicon bulk (i.e., the P-type substrate 101 and the P$^+$-type substrate 123) depending on the wavelength of the photons 122 and create electron-hole pairs. Electrons are generated in depletion and undepletion regions of the silicon bulk. Reference numeral 108 represents the depletion region. Those electrons 110 generated in the undepletion region diffuse to a boundary 109 of the depletion region 108 in which the electrons 110 are quickly swept into a potential well located in the N-type doping region 105. Those electrons 110 generated in the neutral undepletion region can also diffuse laterally and may contribute to a pixel crosstalk. For this reason, the depletion region 108 is formed to a depth Xd suitable for the minimization of the pixel crosstalk.

Since such a high performance pixel has 4 transistors incorporated therein, the pixel requires several signal lines for its operation. Typically, such pixel has a reset line, i.e., the reset gate bus 120, a charge transfer line, i.e., the transfer gate bus 112, and an address line, i.e., the address gate bus 121, in a row direction and the Vdd line 117 and a Vout line, i.e., the pixel column bus 116, in a column direction. Although it is possible to share some of these lines and corresponding transistors between neighboring pixels, this sharing may generate other complications related to intra-pixel interconnecting lines. The increased number of row and column lines tends to consume a valuable pixel area, and thus, often reduces the pixel active area that could otherwise be used for charge storage and light sensing.

SUMMARY OF THE INVENTION

One specific embodiment of the present invention is directed toward providing a complementary metal-oxide semiconductor (CMOS) image sensor with small size pixels having one row address line and one column output line per pixel and no reset and address transistors.

Another specific embodiment of the present invention is directed toward providing a CMOS image sensor using pinned photodiodes for light sensing in conjunction with floating base bipolar transistors incorporated in each pixel, so as to obtain a charge gain, which results in an increase of pixel sensitivity and simultaneously a decrease in noise.

Still another specific embodiment of the preset invention is directed toward providing a vertical blooming control incorporated in each pixel and a current sensing column correlated double sampling (CDS) circuit connected at an interface with horizontal readout circuits, wherein the current sensing column CDS circuit is used for subtracting emitter leakage current and minimizing column-to-column response nonuniformity.

In accordance with one aspect of the present invention, there is provided a pixel of an image sensor, the pixel including a floating base bipolar transistor used to sense charge and a pinned photodiode, wherein the pinned photodiode is coupled to the floating base bipolar transistor through a transfer gate so as to transfer charge from the pinned photodiode to a floating base region of the floating base bipolar transistor.

In accordance with another aspect of the present invention, there is provided an image sensor array, including pixels each of which has a floating base bipolar transistor and a pinned photodiode coupled to the floating base bipolar transistor through a transfer gate so as to transfer charge from the pinned photodiode to a floating base region of the floating base bipolar transistor, and signal lines, wherein transfer gates of pixels on a certain row are coupled to each other and emitter regions of floating base bipolar transistors on a certain column are coupled to each other, thereby forming two signal lines per pixel.

In accordance with still another aspect of the present invention, there is provided an image sensor, including pixels each of which has a floating base bipolar transistor and a pinned photodiode coupled to the floating base bipolar transistor through a transfer gate so as to transfer charge from the pinned photodiode to a floating base region of the floating base bipolar transistor, and a current sensing correlated double sampling (CDS) circuit connected to emitter regions of floating base bipolar transistors on a certain column through a corresponding column output line.

DESCRIPTION OF SPECIFIC EMBODIMENTS

Figure 1:
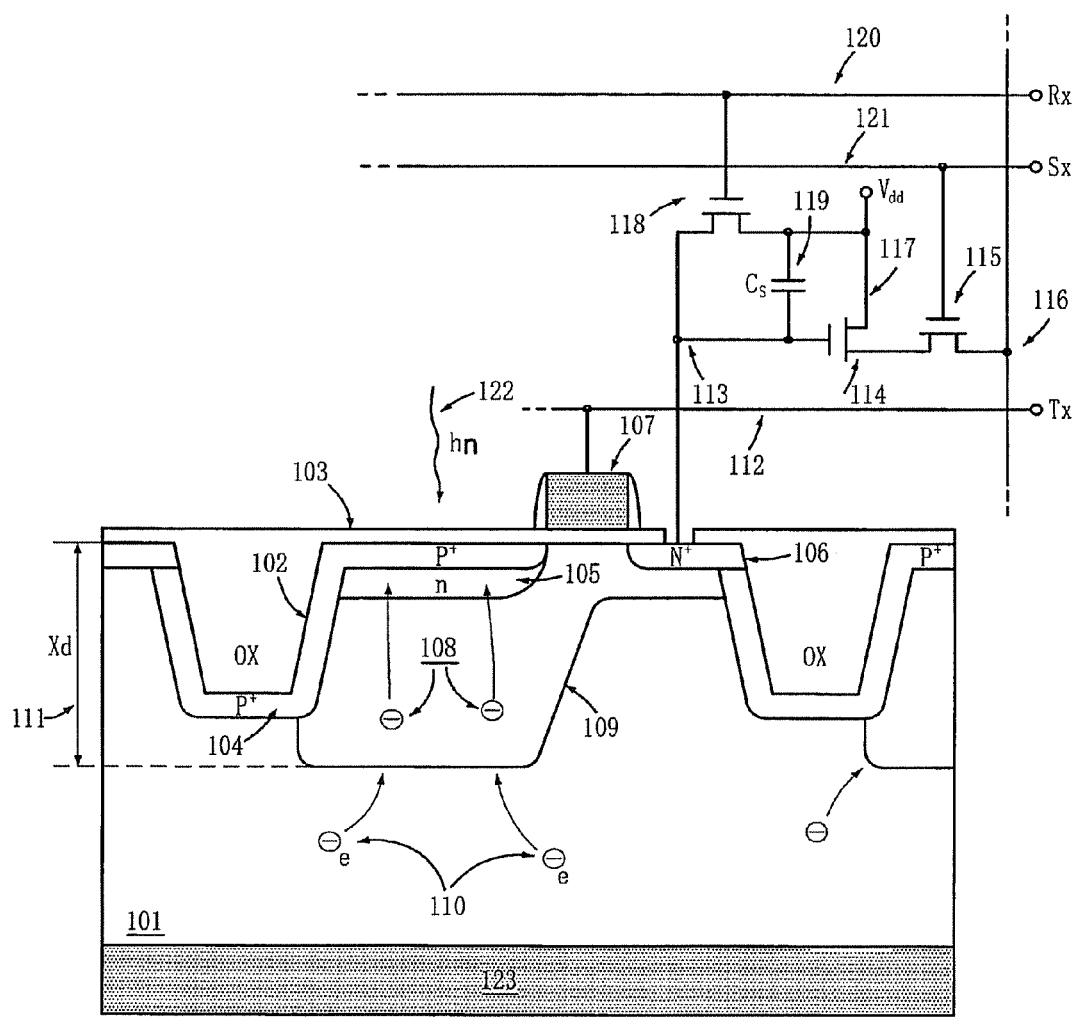
FIG. 1 illustrates a simplified cross-sectional view of a conventional complementary metal-oxide semiconductor (CMOS) image sensor pixel with a pinned photodiode that is typically used in the 4T pixel architecture and an associated pixel circuit.

Various embodiments of the present invention provide a different approach to building small pixel size CMOS image sensors that can address the difficulties associated with the conventional approach. In particular, specific embodiments of the present invention provide small pixels with improved charge storage capacity, increased optical aperture response, and increased sensitivity.

By eliminating reset and address transistors from the pixels and by replacing a charge sensing transistor with a bipolar transistor that has a floating base, it is possible to operate the pixels with one row address line and one column output line. The column output line is common to all pixel emitters in one column, so that no addressing transistor is required. Furthermore, by incorporating the bipolar transistor into, the pixel, a significant charge gain can be obtained before a signal is transferred onto the column output line, and thus, the sensor sensitivity can be substantially increased. Since the pixels have no reset transistors, no kTC-reset noise is generated and thus an improved noise performance is achieved. Using a pinned photodiode in the floating base pixel allows a complete charge transfer with no remaining charge in the photodiode and thus no kTC-rest noise.

Another conventional approach of using bipolar transistors for sensing charge but without a pinned photodiode or still with reset or address transistors has been proposed to achieve small pixel size CMOS image sensors. For example, this conventional approach of using the bipolar transistors can be found in U.S. Pat. No. 6,064,053 issued to M. H. Chi on May 16, 2000, entitled "Operation Methods for Active BiCMOS Pixel for Electronic Shutter and Image-Lag Elimination," U.S. Pat. No. 5,587,596 issued to M. H. Chi et al. on Dec. 24, 1996, entitled "Single MOS Transistor Active Pixel Sensor Cell with Automatic Anti-Blooming and Wide Dynamic Range," and in U.S. Pat. No. 5,608,243 issued to M. W. Chi et al. on Mar. 4, 1997, entitled "Single Split-Gate MOS Transistor Active Pixel Sensor Cell with Automatic Anti-Blooming and Wide Dynamic Range."

Another distinguishing characteristic from the conventional approach is the blooming control, which contributes to a practical design. The vertical blooming control can be achieved by draining excessive charge into a special $N^+$-type buried electrode located deep within a silicon bulk under each photodiode. This blooming control eliminates the need for top side blooming control bias lines and thus maintains a minimum control line count per pixel.

Further another distinguishing characteristic from the conventional approach is the implementation of a special column current sensing correlated double sampling (CDS) readout circuit at a column line interface with horizontal readout circuits. The column current sensing CDS readout circuit allows for subtracting the emitter-base leakage current of the column bipolar transistors and senses the light-induced charge that has been transferred from the pinned photodiode to the floating base of the particular selected bipolar transistor. This circuit is also important for elimination of column-to-column response nonuniformity.

Figure 2:
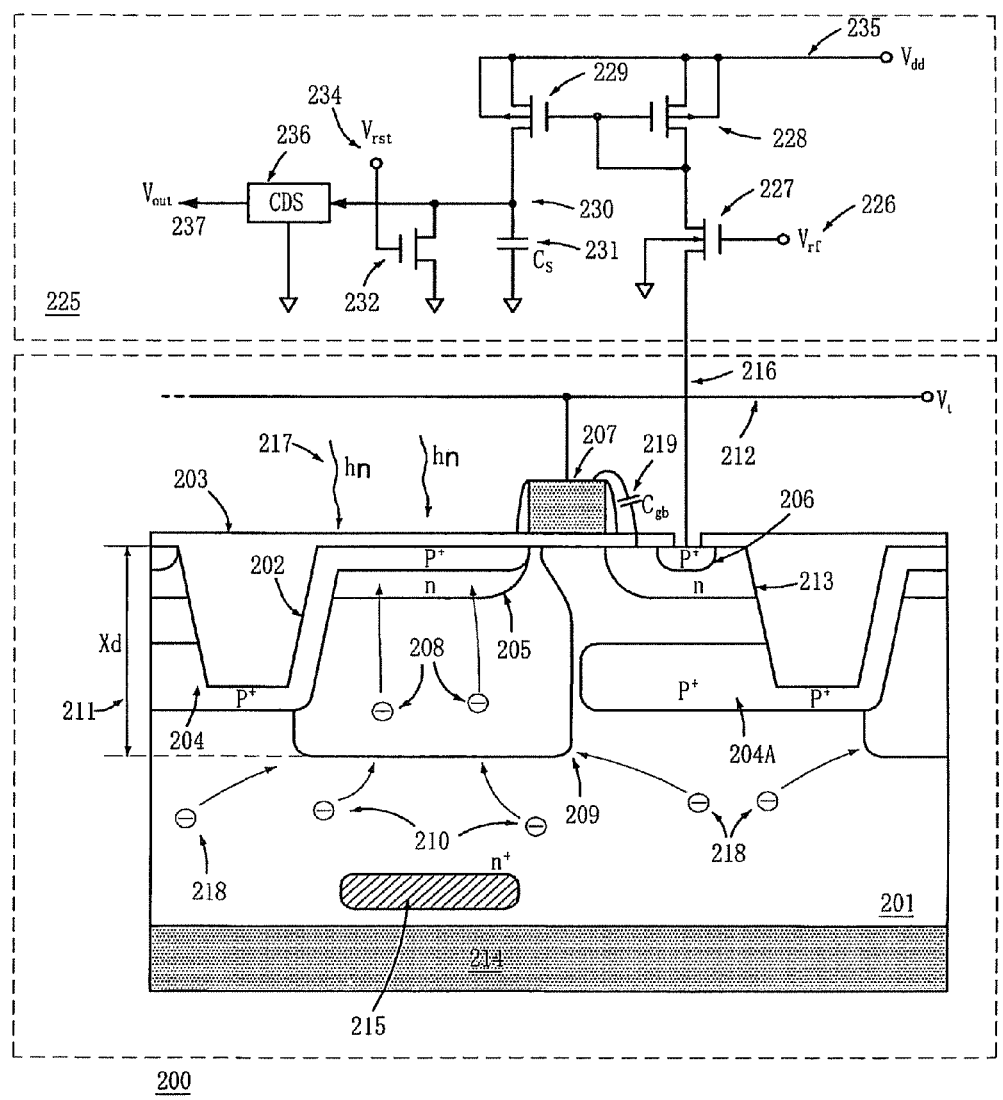
FIG. 2 illustrates a simplified cross-sectional view of a CMOS image sensor pixel with a pinned photodiode and an associated column interface circuit necessary for subtracting column leakage current and minimizing column fixed pattern noise (FPN) in accordance with an embodiment of the present invention.

FIG. 2 illustrates a simplified cross-sectional view of a CMOS image sensor pixel 200 with a pinned photodiode and an associated column interface circuit 225 in accordance with an embodiment of the present invention.

In particular, the exemplified CMOS image sensor pixel 200 may be a floating base bipolar transistor CMOS image sensor pixel, and the column interface circuit 225 may be a column current sensing correlated double sampling (CDS) readout circuit necessary for subtracting column leakage current and minimizing column fixed pattern noise (FPN).

A P-type silicon-based substrate 201 disposed on a $P^+$-type substrate 214 includes a STI region 202 etched in a surface of the P-type substrate 201 and filled with a silicon dioxide layer 203. The silicon dioxide layer 203 also covers the remaining surface of the P-type substrate 201. A shallow $P^+$-type doping region 204 passivates walls and a bottom of the STI region 202 as well as the surface of the P-type substrate 201. The $P^+$-type doping region 204 extends under a floating base (FB)

region 213 to provide a buried collector 204A to a vertical FB transistor formed by an emitter region 206, the FB region 213 and a collector region (i.e., the extending portion of the P+-type doping region 204A).

Photo-generated charge is collected in an N-type doping region 205 of the pinned photodiode. When the charge integration cycle is completed, charge from the N-type doping region 205 is transferred to the FB region 213 by turning a gate 207 momentarily on. When photons 217 impinge on the pixel, the photons 217 penetrate into the silicon bulk (i.e., the P+-type substrate 214 and the P-type substrate 201) depending on the wavelength of the photons and create electron-hole pairs. Electrons are generated in a depletion region 208 and an undepletion region of the P-type substrate 201. Those electrons 210 generated in the undepletion region of the P-type substrate 201 diffuse to a boundary 209 of the depletion region 208 in which the electrons 210 generated, in the undepletion region are quickly swept into a potential well located in the N-type doping region 205. Other electrons 218 generated in a neutral undepletion region can also diffuse laterally and may contribute to pixel crosstalk. Hence, the depletion region 208 is formed to a depth Xd suitable for the minimization of the unwanted pixel crosstalk.

When a well capacity of the pinned photodiode overflows with charge, an overflow "blooming" signal may possibly flow under the gate 207 (e.g., transfer gate) into the FB region 213 even when the transfer gate 207 is turned off. This flow of the overflow "blooming" signal may cause false leakage current in a column output line 216 which may adversely affect a normal signal from other pixels connected to the same column output line 216. Thus, it is desirable to prevent this blooming phenomenon. The anti-blooming effect can be accomplished by placing a patterned N+-type drain region 215 under each pixel. The N+-type drain region 215 can be biased to a suitable voltage level such that the overflow charge does not flow into the FB region 213, but preferably flows into the N+-type drain region 215. An electrical connection to the N-type drain region 215 is made at the periphery of a pixel array because the blooming current is typically very low and no additional metal lines need to be added to the pixel.

Signal electrons transferred into the FB region 213 (i.e., the FB of the vertical FB bipolar transistor) cause the reduction in a built-in potential barrier in the FE region 213 and a subsequent injection of holes from the emitter region 206 into the FE region 213 and further down into the extended portion of the P+-type doping region 204A (i.e., the collector region) where the holes join a majority of carriers present in the P+-type doping region 204A. The flow of holes through the FE region 213 into the collector region 204A will continue until the recombination of electrons with the holes in the FE region 213 eliminates the transferred electrons. This electron-hole recombination generally resets this FE region 213 to the original potential. The probability of the electron-hole recombination depends on the doping concentration and the geometry of the FB region 213 and it can be made relatively low. As a result, the number of holes required for the recombination may be large and thus, a significant gain of the original photo-generated electron can be obtained. This result is the well-known principle for the operation of a typical bipolar transistor. However, the present embodiment introduces the floating base that is not connected to any circuit node. The floating base according to the present embodiment is one advantage, since the base-emitter capacitance is typically very small, resulting in very small kTC-reset noise.

The emitter region 206 of the vertical FB bipolar transistor is connected to the column current sensing CDS readout circuit 225 through the common column output line 216. The column current sensing CDS readout circuit 225 includes a reference N-type channel transistor 227 that establishes a reference voltage bias of the column output line 216 according to a bias voltage Vrf applied from a bias voltage terminal 226 to a gate of the reference N-type channel transistor 227. One terminal of the reference N-type channel transistor 227 is connected to a P-type channel current mirror formed by transistors 228 and 229, which are biased at a bias voltage level of the power supply voltage Vdd supplied to the target elements of the column current sensing CDS readout circuit 225 by a Vdd line 235. One output terminal of the current mirror is connected to a node 230, which is also connected to a transistor 232 (e.g., a reset transistor) and to an integrating capacitor 231. The integrating capacitor 231, which is labeled as Cs in FIG. 2, is reset when a pulse is supplied to a gate terminal 234. This reset activity is performed every time before a pixel is read.

When charge is transferred from the pinned photodiode into the FB region 213 of the vertical FB bipolar transistor, the resulting current of the emitter region 206 is mirrored by the current mirror and will charge the integrating capacitor 231 to a corresponding voltage that will appear on the node 230. This voltage signal is supplied to a CDS circuit 236 that will further process the voltage signal. The CDS circuit 236 operates in a digital domain according to a specific multipoint sampling and calculation algorithm.

Figure 3:
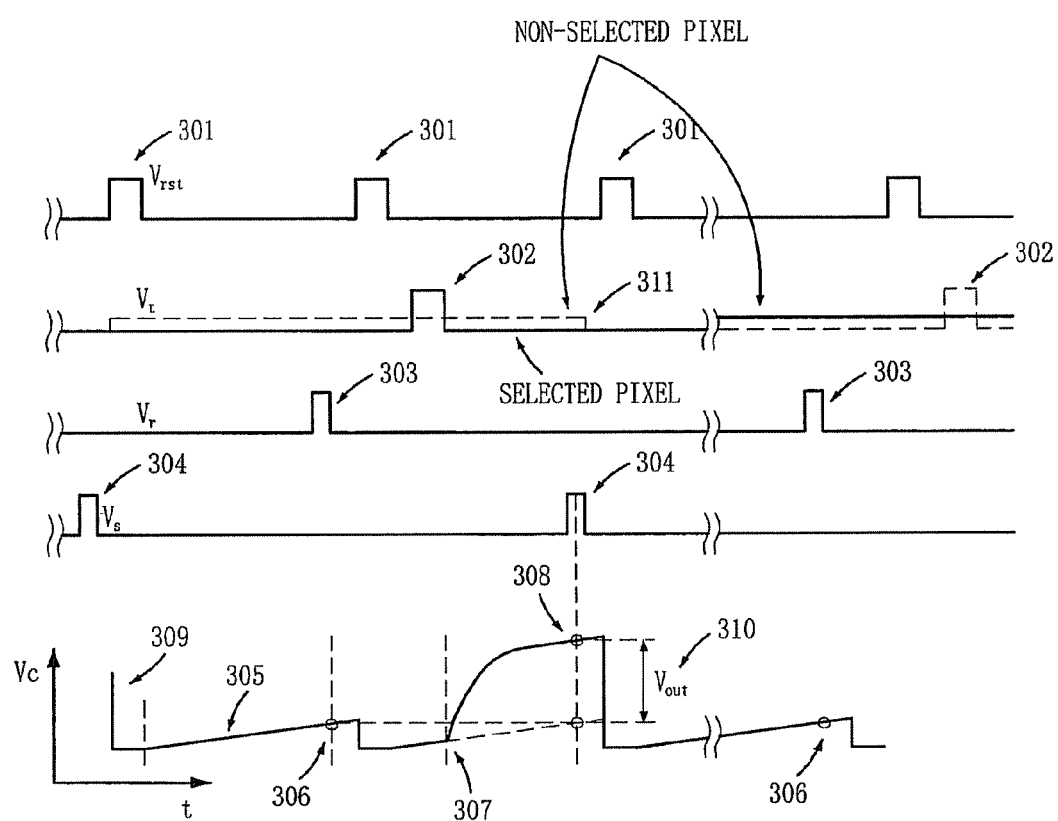
FIG. 3 illustrates a simplified output waveform and a timing diagram for the operation of a CMOS image sensor pixel with a floating base bipolar transistor and an associated column current sensing CDS readout circuit in accordance with an embodiment of the present invention.

FIG. 3 illustrates a simplified output waveform and a timing diagram for the operation of the CMOS image sensor pixel with the floating base bipolar transistor and the associated column current sensing CDS readout circuit in accordance with an embodiment of the present invention. In particular, the illustrated output waveform shows exemplary output voltages that can appear on the node 230 (see FIG. 2), and the illustrated operational timing diagram is associated with the column current sensing CDS readout circuit 225 (see FIG. 2).

First pulses 301 represent reset pulses Vrst applied to the gate terminal 234 of the reset transistor 232. Second pulses 302 represent charge transfer pulses Vt applied to the gate 207, in this case, the gate of the transfer transistor, through a charge transfer line 212. Third pulses 303 represent reference level sampling pulses Vr and are internal to the CDS circuit 236. Fourth pulses 304 represent signal sampling pulses Vs and are internal to the CDS circuit 236. A graph 309 represents the voltage appearing on the integrating capacitor 231.

The CDS circuit 236 functions as follows. After the first pulse 301 is turned off, the voltage on the capacitor 231 starts to rise due to the leakage current from those emitter regions 206 connected commonly to the column output line 216. This voltage is sampled by the third pulse 303 at a first voltage level 306. After this cycle is completed, the capacitor 231 is reset and starts to integrate the leakage signal again. However, after the second pulse 302 is applied to the selected pixel illustrated in FIG. 2, the voltage on the capacitor 231 starts to rise from a second voltage level 307 rapidly due to the current corresponding to the leakage current and the signal current from the emitter region 206 of the selected FB bipolar transistor. This voltage is sampled by the fourth pulse 304 at a third voltage level 308.

The photo-induced signal has a voltage level difference between the third voltage level 308 and the first voltage level 306. Thus, the signal due to the leakage current is subtracted. However, since the multiple emitter regions 206 are connected commonly to one column output line 216, the leakage current may be significant. A small positive pixel pulse 311 is applied to the gates of the non-selected transfer transistors during the charge transfer from the selected pixel row in order to minimize the leakage current. The amplitude of this pulse is determined to be just below the charge transfer threshold of the gate 207 of the transfer transistor. This pulse causes those non-selected FB regions to be slightly reverse biased due to the pulse feed through capacitance Cgb 219 (see FIG. 2) that is typically formed between the gate 207 and the selected FB region 213. The small reverse bias reduces the aggregate leakage on the column output line 216 and allows the leakage of the selected row transistor to be present.

The action of the CDS circuit 236 described above removes the remaining leakage signal. The leakage signal subtraction is performed by the CDS circuit 236 and the output of the CDS circuit 236 appears at an output terminal 237. More complex signal processing, is also possible by converting the signal on the capacitor 231 to a digital equivalent followed by a digital subtraction operation. The leakage current signal can also be sampled in many instances before and also after the charge transfer gate pulse is applied to the pixel, and more sophisticated nonlinear computation can be used for more accurate elimination of the leakage current from the signal.

Figure 4:
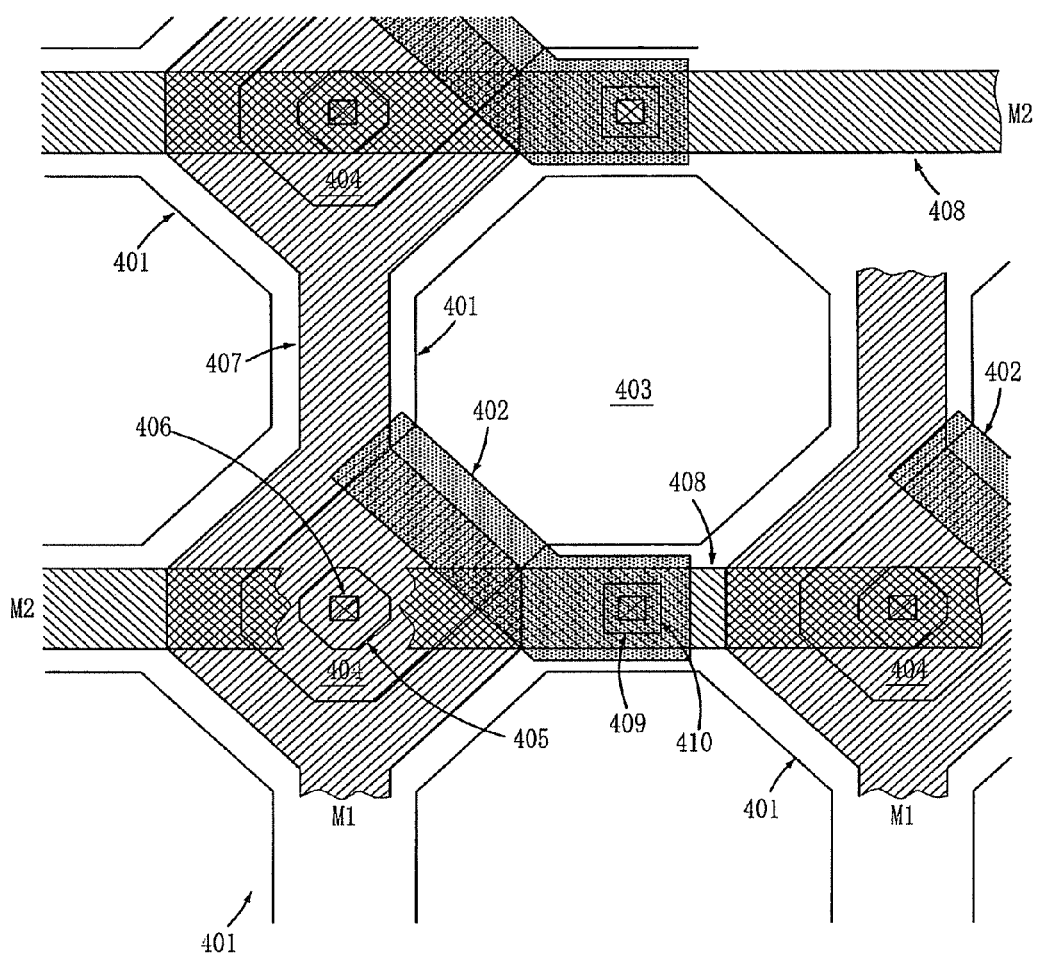
FIG. 4 illustrates a simplified diagram of one implementation of a CMOS image sensor pixel with a floating base bipolar transistor as placed in a typical image sensor array in accordance with an embodiment of the present invention.

FIG. 4 illustrates one implementation of a layout of a CMOS image sensor pixel with a vertical FB bipolar transistor and a pinned photodiode in accordance with an embodiment of the present invention, wherein the vertical FB bipolar transistor and the pinned photodiode are arranged in a diagonal direction and the pinned photodiode has an approximately rounded octahedral shape.

Photodiode regions 403 that receive light are delineated by respective active region borders 401 and transfer gates 402, which are formed of polysilicon. Reference numerals 404 and 405 represent FB regions and P+-type diffusion emitter regions of the vertical FB bipolar transistors, respectively. Contact regions 406 each connect the respective emitter regions 405 to corresponding column bus lines 407 formed by first metal layers M1. The first metal layers M1 cover the FB regions 404 and partially the transfer gates 402. This feature is important for a light shielding effect and also for the reduction of optical crosstalk. The transfer gates 402 are in contact with bus lines 408 formed by second metal layers M2 through respective openings 410 and respective first metal pads 409, respectively. The approximately round octahedral shape of the light sensing photodiode regions 403 with the diagonal placement of the FB bipolar transistors is another advantage of this exemplary pixel. This feature provides a good symmetry to the structure with an efficient light focusing capability by microlenses that are generally placed over the photodiodes. The FB bipolar transistors are placed diagonally in those regions where the efficiency of the microlens focusing capability is the weakest so as to allow no additional light sacrifice. Other photodiode shapes are also possible to be used with this exemplary pixel as is well known to those skilled in the art. However, the diagonal placement of the charge sensing transistors (e.g., FB bipolar transistors) is particularly advantageous with this pixel. Also, it should be noted that the above described embodiments show the implementation of the pixels in CMOS image sensors, the pixels can still be implemented in many other image sensors or related devices.

According to various embodiments of the present invention, the CMOS image sensor includes small-size pixels each having one row address line and one column output line per pixel without using reset and address transistors. Each of the pixels is incorporated with a FE bipolar transistor and a pinned photodiode for light sensing. With this specific structure, the CMOS image sensor can provide a charge gain, which can contribute to an increase in pixel sensitivity and a decrease in noise.

Various embodiments of the present invention are directed toward the CMOS image sensor pixel with the associated column signal processing circuit (e.g., column current sensing CDS readout circuit), including the pinned photodiode, the FB bipolar transistor for sensing charge, and one address line and one output line per pixel. However, this structure of the CMOS image sensor pixel is intended to be illustrative and not limiting, and it should be noted that the persons skilled in the art can make modifications and variations in light of the above teachings. It is therefore to be understood that changes may be made in the particular embodiments of the invention disclosed, which are within the scope and spirit of the invention as defined by appended claims.

The invention claimed is:

1. A method for operating an image sensor, the method comprising:
applying a first voltage to a gate of a transfer transistor of a selected pixel; and
applying a second voltage to a gate of a transfer transistor of a non-selected pixel to reverse bias a floating base region of the non-selected pixel;
wherein:
the first voltage is positive;
the second voltage is positive; and
the second voltage is less than the first voltage.

2. The method of claim 1, wherein:
the first voltage is greater than a charge transfer threshold of the gate of the transfer transistor of the selected pixel; and
the second voltage is less than a charge transfer threshold of the gate of the transfer transistor of the non-selected pixel.

3. The method of claim 1, wherein said reverse biasing a floating base region of the non-selected pixel reduces a leakage of charge from the floating base region of the non-selected pixel to a column output line associated with the non-selected pixel.

4. The method of claim 1, wherein the floating base region of the non-selected pixel comprises an emitter of a bipolar junction transistor.

5. The method of claim 4, wherein the floating base region of the non-selected pixel further comprises a P-type region.

6. The method of claim 4, wherein the bipolar junction transistor is vertically arranged in the non-selected pixel.

7. A method for operating a pixel in an image sensor, wherein the pixel comprises a transfer transistor and a floating base region, the method comprising:
while the pixel is selected, applying a first voltage to a gate of the transfer transistor; and
while the pixel is not selected, applying a second voltage to the gate of the transfer transistor to reverse bias the floating base region;
wherein:
the first voltage is positive;
the second voltage is positive; and
the second voltage is less than the first voltage.

8. The method of claim 7, wherein:
the first voltage is greater than a charge transfer threshold of the gate of the transfer transistor; and
the second voltage is less than the charge transfer threshold of the gate of the transfer transistor.

9. The method of claim 7, wherein said reverse biasing the floating base region reduces a leakage of charge from the floating base region to a column output line associated with the pixel.

10. The method of claim 7, wherein the floating base region comprises an emitter of a bipolar junction transistor.

11. The method of claim 10, wherein the floating base region further comprises a P-type region.

12. The method of claim 10, wherein the bipolar junction transistor is vertically arranged in the pixel.

13. A method for operating a pixel in an image sensor, wherein the pixel comprises a transfer transistor and a floating base region, the method comprising:

while the pixel is selected:

initially applying a third voltage to a gate of the transfer transistor;

subsequently applying a first voltage to the gate of the transfer transistor; and subsequently applying the third voltage to the gate of the transfer transistor; and while the pixel is not selected, applying a second voltage to the gate of the transfer transistor;

wherein:

the first voltage is greater than the second voltage; and the second voltage is greater than the third voltage.

14. The method of claim 13, wherein:

the first voltage is greater than a charge transfer threshold of the gate of the transfer transistor; and the second voltage is less than the charge transfer threshold of the gate of the transfer transistor.

15. The method of claim 13, wherein said applying a second voltage comprises reverse biasing the floating base region.

16. The method of claim 15, wherein said reverse biasing the floating base region reduces a leakage of charge from the floating base region to a column output line associated with the pixel.

17. The method of claim 16, wherein the floating base region comprises an emitter of a bipolar junction transistor.

18. The method of claim 17, wherein the bipolar junction transistor is vertically arranged in the pixel.

* * * * *